United States Patent [19]

Kirkpatrick

[11] 4,325,455

[45] Apr. 20, 1982

[54] LOUDSPEAKER GRILLE

[75] Inventor: Maurice Kirkpatrick, High Wycombe, England

[73] Assignees: Tannoy Products Limited, High Wycombe; Lenver Products Limited, Brentwood, both of England

[21] Appl. No.: 37,847

[22] Filed: May 10, 1979

[30] Foreign Application Priority Data

May 12, 1978 [GB] United Kingdom ............... 19294/78

[51] Int. Cl.³ ............................................... H05K 5/00

[52] U.S. Cl. ..................................... 181/148; 181/199

[58] Field of Search ............... 181/141, 148, 155, 149, 181/175, 199, 150, 158, 151-154, 156; 428/122, 130, 154, 177; D14/39; 220/8; 179/107 R, 146 E, 184; 312/7 R, 242, 258

[56] References Cited

U.S. PATENT DOCUMENTS

| | | | |
|---|---|---|---|
| 2,087,901 | 7/1937 | Coots | 181/199 |
| 2,154,741 | 4/1939 | Gray | 220/8 |
| 2,500,301 | 3/1950 | Tresise et al. | 179/107 R |
| 2,885,024 | 5/1959 | Jordan | 181/199 |
| 3,059,720 | 10/1962 | Mutsuoka | 179/146 E |
| 3,188,374 | 6/1965 | Schotter | 181/175 |
| 3,595,337 | 7/1971 | Furey et al. | 181/155 |

FOREIGN PATENT DOCUMENTS

| | | | |
|---|---|---|---|
| 2,547,648 | 4/1977 | Fed. Rep. of Germany | 179/146E |
| 858,458 | 1/1961 | United Kingdom. | |
| 1,249,501 | 1/1971 | United Kingdom. | |
| 1,249,950 | 1/1971 | United Kingdom. | |
| 1,418,148 | 1/1975 | United Kingdom. | |

*Primary Examiner*—L. T. Hix
*Assistant Examiner*—Benjamin R. Fuller
*Attorney, Agent, or Firm*—Andrus, Sceales, Starke & Sawall

[57] ABSTRACT

A loudspeaker grille made of stiff material such as stiffened grille cloth, has at least a major proportion of the length of its edge so shaped that, when seen in cross section, one part extends rearwardly, approximately perpendicularly to the plane of the grille, and another part returns forwardly again from the rear edge of the first part and at an acute angle to the first part so as to present a free edge lying to the rear of the plane of the grille and outwardly of the first part. Both parts of the edge portion, when seen in cross section, may be straight and define a generally V-shaped configuration of which the included angle may be between 30 degrees and 45 degrees prior to fitting the grille in position in a loudspeaker. The edge portion is then held in a groove in the housing of a loudspeaker as a result of the resilience of the edge portion.

2 Claims, 4 Drawing Figures

Fig.1
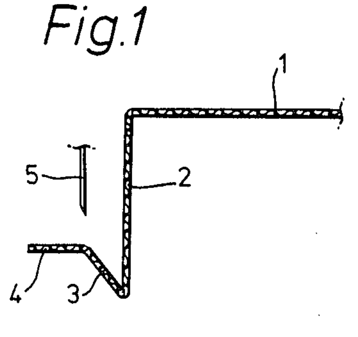
Fig.2
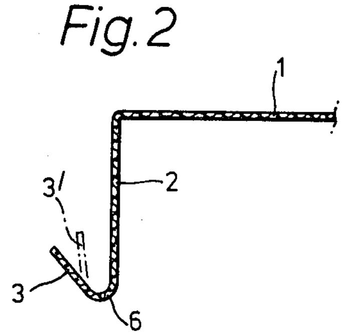
Fig.3
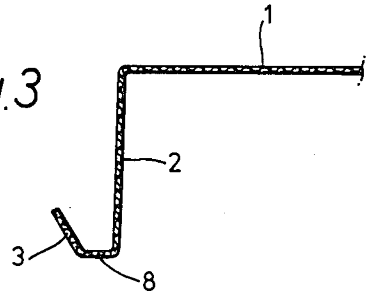
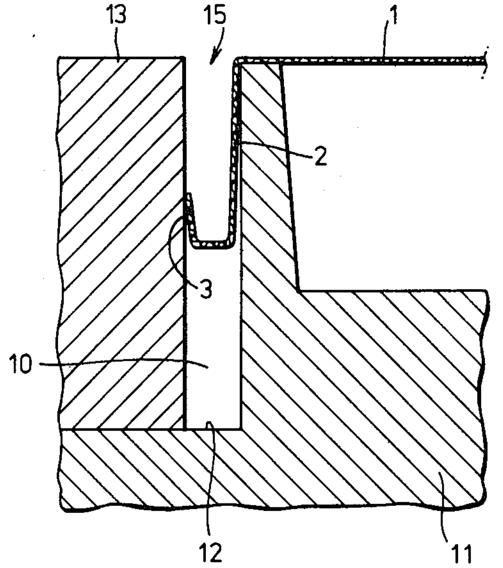
Fig.4

LOUDSPEAKER GRILLE

Grilles for loudspeakers need to be maintained in a smooth flat configuration and are therefore normally fitted under tension. This effect is assisted if a stiff material is used for the grille, e.g. if the grille cloth, which is commonly used for the purpose, is stiffened; the rigidity may be further increased by the formation of a relief design across the stiffened cloth. Even with these additional measures, however, the fixing needs to be adequate to maintain the tension and represents a relatively large proportion of the total cost of the grille. For example, co-operating pads of pile-type fastener such as that available commercially under the Registered Trade Mark "Velcro" may be fitted to the rear of the stiffened grille and to the loudspeaker housing. This adds a further step to the assembly process and, in any vent, such fasteners are expensive.

According to the present invention, a loudspeaker grille made of stiff material has at least a major porporation of the length of its edge so shaped that, when seen in cross section, one part extends rearwardly, approximately perpendicularly to the plane of the grille, and another part returns forwardly again from the rear edge of the first part and at an acute angle to the first part so as to present a free edge lying to the rear of the plane of the grille and outwardly of the first part. When fitting the grille in position, the shaped portion of the edge of the grille is inserted in a groove in the housing of width slightly less than that between the free edge and the said first part so as to introduce a slight degree of compression and cause the free edge to press against the outer surface of the groove. It is found that such a construction not only maintains tension in the grille, but also holds it in position without the need for any further fixing at all. This not only simplifies the assembly procedure, since all that is necessary is to press the shaped edge portion of the grille into its groove, but also leads to a material saving in the overall cost since no separate fixing devices are required.

As mentioned previously, a stiffened grille cloth may be used, but this is by no means essential and, for example, a moulded perforated plastics grille may be used instead.

In the simplest form of arrangement, both parts of the edge portion, when seen in cross section, are straight and define a generally V-shaped configuration of which the included angle may conveniently lie between 30 and 45 degrees prior to fitting the grille in position. This angle is then slightly reduced when the edge portion is pressed into its fixing groove. Alternatives to a V-shape include trought-shaped configurations where the relatively sharp angle of the V is replaced by a rounded bottom or a flat bottom.

One convenient method of obtaining the required shaping of the edge portion of the grille, when using a stiffened grille cloth, is by means of a heated press for pressing a sheet of grille cloth previously impregnated with a thermoplastic stiffening agent such, for example, as a polystyrene emulsion in a liquid carrier. It is important that the free edge which, as previously described, is primarily responsible for the gripping action should be straight. For this purpose, the heated press may conveniently be designed to give a cross-sectional shape of edge portion which, in addition to the two parts lying at an acute angle to one another, has a third part extending from the second part. After removal from the press and cooling, the third part is then removed by guillotining to leave a straight free edge on the second part. It is not essential that the described shaping should be applied to the whole of the length of the edge of the grille since adequate fixing can be obtained if lengths of the edge are unshaped. Nevertheless, there is no practical advantage in this and, generally speaking, it is simplest for the whole of the edge to be so shaped except perhaps for a short length of the corners in the case of a rectangular grille.

Examples of loudspeaker grille in accordance with the invention will now be described with reference to the accompanying drawings, in which:

FIGS. 1, 2 and 3 are diagrammatic cross sectional views of the edge of different constructions of grille; and FIG. 4 shows the configuration of edge portion shown in FIG. 3 when fitted in position to a loudspeaker.

In FIG. 1 the main plane of the grille is shown as 1, its upper surface representing the forwardly facing direction. At its edge, the grille has a part 2 which extends rearwardly from the plane 1 at an angle which is approximately a right angle, but wich may be slightly greater so that the part 2 has to be displaced slightly in relation to the plane 1 when fitting the grille in position. From the part 2, a further part 3 extends forwardly again towards the plane 1 to define a V-shaped configuration having an included angle which, as previously mentioned, may lie in a range between 30 degrees and 45 degrees. Initially a further part 4 extends from the part 3 as a result of the forming operation and this is subsequently removed by means of a guillotine blade shown diagrammatically as 5 to leave a straight free edge along the part 3. Although not shown in FIG. 1, when using a stiffened grille cloth, the fibrous nature of the cloth tends to leave minor irregularities in this straight edge which assist its gripping action against the side of its receiving groove illustrated in FIG. 4.

FIG. 2 shows a minor variation on the configuration of FIG. 1 in that the part 3 defines a rather more rounded V-shape 6 than in FIG. 1, which may be regarded as somewhat trough-shaped. When inserted in the fixing groove, the part 3 is displaced inwardly to the dotted line position shown as 3' against the effect of its own resilience so as to exert a gripping pressure on the outer edge of the groove. FIG. 2 shows the part 3 after removal of the part 4 by guillotining, so that its free edge is in the form of a straight line.

FIG. 3 shows a further minor variation in which the portions 2 and 3 are inter-connected by a flat portion 8, the included angle between the surfaces 2 and 3 again being the same as in FIGS. 1 and 2. Once again, a similar gripping action is obtained. Typical ranges of dimensions for the parts 2 and 3 are 5 mm to 35 mm and 2 mm to 10 mm respectively.

The cross section of the groove in which the shaped edge portion of the grille is received will normally be of generally rectangular configuration and if the loudspeaker housing is moulded, this groove may be included as part of the basic moulding operation. Alternatively, if the housing is made of wood, the groove may be milled or may be formed as part of the basic construction of the housing. As illustrated in FIG. 4, a groove 10 which extends around the whole periphery of the grille is defined between a central component 11 which is formed with a shoulder 12 and an outer ring 13 which is seated on the shoulder 12 to leave a gap defining the groove 10 and of a width somewhat less than the relaxed configuration of the edge portion 2, 3 of the grille. FIG. 4 shows a grille having the edge configuration illustrated in FIG. 3 fitted into the groove 10. It will be seen that the part 3 has been pressed inwardly towards the part 2 so as to reduce the included angle between them, the natural resilience of the stiffened grille material pressing the part 3 outwardly against the surface of the ring 13 so that its free edge exerts a gripping action as previously described.

The close fit of the part 2 of the edge with the inner face of the groove 10 defined by the part 11 ensures that the necessary tension is applied to the grille which is fitted in position merely by pressing the edge portion 2, 3 into the groove 10 and can, if required, be removed in a similar manner. If required, the mouth of the groove, shown as 15, may be filled with appropriately shaped trim (not shown in the drawing) after the grille has been fitted in position, but this is in no way required for fixing purposes and serves only as decoration.

I claim:

1. A loud speaker grille for covering a speaker positioned in an enclosure having a groove, said grille being formed of a stiffened, resilient, fibrous, grille cloth material and having a central portion suitable for covering the speaker, said grille having at least a major portion of the length of its edge so shaped that, when seen in cross-section, a first part of said edge extends rearwardly of said central portion approximately perpendicularly to the plane of said grille, and a second part of said edge is affixed to the rear edge of said first part and returns forwardly again from said rear edge of said first part to lie at an acute angle with respect to said first part, said first and second parts forming a generally V-shaped configuration, said second part presenting a free edge lying to the rear of the plane of said grille by an amount sufficient to cause said free edge to reside in the groove when said grille is installed on the enclosure, said free edge being spaced from said first part by a distance greater than the width of the groove, said first and second parts being insertable in the groove so that said free edge is forced into engagement with the side of the groove by the resiliency of said material to retain said grille on the enclosure.

2. A loudspeaker grille according to claim 1 in which the included angle between said parts of said edge portion is between 30 degrees and 45 degrees prior to fitting said grille in position in a loudspeaker.

* * * * *